US012601080B2

(12) United States Patent
Mayer

(10) Patent No.: US 12,601,080 B2
(45) Date of Patent: Apr. 14, 2026

(54) HIGH-SPEED 3D METAL PRINTING OF SEMICONDUCTOR METAL INTERCONNECTS

(71) Applicant: LAM RESEARCH CORPORATION, Fremont, CA (US)

(72) Inventor: Steven T. Mayer, Aurora, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 636 days.

(21) Appl. No.: 17/789,734

(22) PCT Filed: Jan. 8, 2021

(86) PCT No.: PCT/US2021/012589
§ 371 (c)(1),
(2) Date: Jun. 28, 2022

(87) PCT Pub. No.: WO2021/142187
PCT Pub. Date: Jul. 15, 2021

(65) Prior Publication Data
US 2023/0035849 A1 Feb. 2, 2023

Related U.S. Application Data

(60) Provisional application No. 62/958,930, filed on Jan. 9, 2020.

(51) Int. Cl.
*C25D 21/12* (2006.01)
*C25D 5/02* (2006.01)
(Continued)

(52) U.S. Cl.
CPC .............. *C25D 5/02* (2013.01); *C25D 7/123* (2013.01); *C25D 17/001* (2013.01); *C25D 21/10* (2013.01);
(Continued)

(58) Field of Classification Search
None
See application file for complete search history.

(56) References Cited

U.S. PATENT DOCUMENTS

| | | | |
|---|---|---|---|
| 2004/0094427 A1* | 5/2004 | Economikos | H01L 21/7684 257/E21.175 |
| 2004/0256245 A1 | 12/2004 | Wang | |

(Continued)

FOREIGN PATENT DOCUMENTS

| | | |
|---|---|---|
| JP | 2000220000 A | 8/2000 |
| JP | 2002520850 A | 7/2002 |

(Continued)

OTHER PUBLICATIONS

International Search Report and Written Opinion of the ISA issued in PCT/US2021/012589, mailed Apr. 27, 2021; ISA/KR.
(Continued)

*Primary Examiner* — Stefanie S Wittenberg

(57) ABSTRACT

A system for printing metal interconnects on a substrate includes an anode substrate. A plurality of anodes are arranged on one side of the anode substrate with a first predetermined gap between adjacent ones of the plurality of anodes. A first plurality of fluid holes have one end located between the plurality of anodes. A plurality of control devices is configured to selectively supply current to the plurality of anodes, respectively. The anode substrate is arranged within a second predetermined gap of a work piece substrate including a metal seed layer. A ratio of the second predetermined gap to the first predetermined gap is in a range from 0.5:1 and 1.5:1. An array controller is configured to energize selected ones of the plurality of anodes using corresponding ones of the plurality of control devices while electrolyte solution is supplied through the first plurality of fluid holes between the anode substrate and the work piece substrate.

24 Claims, 12 Drawing Sheets

(51) Int. Cl.

| | |
|---|---|
| *C25D 7/12* | (2006.01) |
| *C25D 17/00* | (2006.01) |
| *C25D 21/10* | (2006.01) |
| *H01L 21/288* | (2006.01) |
| *H01L 21/768* | (2006.01) |

(52) U.S. Cl.

CPC .......... *C25D 21/12* (2013.01); *H01L 21/2885* (2013.01); *H01L 21/76838* (2013.01)

(56) References Cited

U.S. PATENT DOCUMENTS

| | | | |
|---|---|---|---|
| 2005/0161336 A1 | 7/2005 | Woodruff et al. | |
| 2006/0292845 A1* | 12/2006 | Chiang | H01L 21/67207 |
| | | | 257/E21.295 |
| 2007/0034502 A1 | 2/2007 | Kumekawa et al. | |
| 2007/0068819 A1 | 3/2007 | Singh et al. | |
| 2007/0089993 A1* | 4/2007 | Schwartz | B33Y 30/00 |
| | | | 204/224 R |
| 2007/0221504 A1* | 9/2007 | Luo | C25D 21/14 |
| | | | 205/118 |
| 2016/0108538 A1* | 4/2016 | Iwatsu | C25D 17/001 |
| | | | 204/242 |
| 2017/0073830 A1 | 3/2017 | Higuchi | |
| 2017/0145584 A1* | 5/2017 | Wirth | C25D 17/12 |
| 2018/0073160 A1* | 3/2018 | Higuchi | C25D 3/38 |

FOREIGN PATENT DOCUMENTS

| | | |
|---|---|---|
| JP | 2004510888 A | 4/2004 |
| JP | 2006506523 A | 2/2006 |
| JP | 2007050506 A | 3/2007 |
| JP | 2007507615 A | 3/2007 |
| JP | 2017115221 A | 6/2017 |
| WO | WO-2014188897 A1 | 11/2014 |

OTHER PUBLICATIONS

Japanese Office Action for Application No. 2022-541793 dated Mar. 4, 2025.

Japanese Decision to Grant for Japanese Application No. 2022-541793 dated Sep. 19, 2025.

* cited by examiner

HIGH-SPEED 3D METAL PRINTING OF SEMICONDUCTOR METAL INTERCONNECTS

CROSS-REFERENCE TO RELATED APPLICATIONS

This application is a U.S. National Phase Application under 35 U.S.C. 371 of International Application No. PCT/US2021/012589, filed on Jan. 8, 2021, which claims the benefit of U.S. Provisional Application No. 62/958,930, filed on Jan. 9, 2020. The entire disclosures of the applications referenced above are incorporated herein by reference.

FIELD

The present disclosure relates to substrate processing systems and more particularly to printing of semiconductor electrical interconnects.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Semiconductor interconnects are generally formed using Damascene processing or through resist processing and metallization. Damascene processing is commonly used for interconnects of higher aspect ratio through silicon vias (TSVs) and levels greater than 3 with sub 0.5 micrometer (μm) fluid holes and line interconnects. Through resist processing and metallization is commonly used for packaging interconnect formation (re-distribution layers, copper pillar bumping, controlled collapse chip connection (C4) plated solder bumps, etc.) of sizes greater than about 1 μm and less than about 3 layers.

Each of these processes uses several ancillary processes and hardware (photoresist applications, lithography, photoresist development, photoresist stripping and cleaning, chemical mechanical polishing, wet etching) in addition to electroplating of the desired current carrying metal interconnect line/via.

Damascene metallization processes (including through silicon vias (TSVs)) form a recessed cavity in a dielectric film (such as low dielectric constant (K) silicon dioxide ($SiO_2$)). An etch region is defined in the dielectric film using lithography as a mask or forming a mask (such as a metal film). This step is usually followed by physical vapor deposition (PVD) metallization of an exposed surface to coat external and internal surfaces with a seed layer and a barrier layer (typically copper (Cu) and tantalum (Ta), titanium (Ti), titanium nitride (TiN), tantalum nitride (TaN))).

The PVD metallization typically has high side wall coverage selectivity so that edge walls of the Damascene structures, particularly at the bottom of the structure, are sufficiently covered to allow for complete electrical connection and plating bottom up filling. Then the recessed structure is plated from the "bottom up" and chemical mechanical polishing (CMP) of the surface leaves an isolated line/via lying below the general surface.

Through resist processing and metallization are used to form bumps and/or lines that, at the end of processing, yield interconnect structures that lie above the general surface. Through resist processing and metallization involves seeding an exposed surface (for example, blanket PVD metal layers of copper/2000 Angstroms (Å) over Ta/200 Å). Then, a dry photoresist film is applied or spin coating is used to apply a wet photoresist layer (which is dried/cured). The photoresist layer can be either positive or negative tone (exposed areas are removed or remain after development). Then, the photoresist is exposed to light in a lithographic step. Then, the photoresist is selectively removed by immersion in a developing solution suitable for the particular type and chemical formulation of the photoresist. Residual photoresist that remains after development at the base of the features is removed by exposing the wafer surface to an oxygen plasma (sometime referred to as a "descum step"). Generally during this step oxygen end groups replace hydrophobic organic end groups at the photoresist surface, which makes the organic photoresist film more hydrophilic. The wafer then has a set of photoresist openings down to the seed layer and is plated to fill those openings to form a bump, a line, a thick solder film (reflowed to form a ball), or a thinner layer of solder on the top of a copper bump to form a copper/solder (e.g. Cu/SnAg) pillar.

SUMMARY

A system for printing metal interconnects on a substrate includes an anode substrate. A plurality of anodes are arranged on one side of the anode substrate with a first predetermined gap between adjacent ones of the plurality of anodes. A first plurality of fluid holes have one end located between the plurality of anodes. A plurality of control devices is configured to selectively supply current to the plurality of anodes, respectively.

The anode substrate is arranged within a second predetermined gap of a work piece substrate including a metal seed layer. A ratio of the second predetermined gap to the first predetermined gap is in a range from 0.5:1 and 1.5:1. An array controller is configured to energize selected ones of the plurality of anodes using corresponding ones of the plurality of control devices while electrolyte solution is supplied through the first plurality of fluid holes between the anode substrate and the work piece substrate.

In other features, the plurality of anodes comprise inert anodes and the electrolyte solution comprises includes metal cations. The anode substrate further includes a second plurality of fluid holes that are located between the plurality of anodes to remove the electrolyte solution between the anode substrate and the work piece substrate. The anode substrate includes a plenum in fluid communication with an electrolyte source. A manifold is arranged adjacent to the anode substrate and includes inlets in fluid communication with an electrolyte source and outlets in fluid communication with the first plurality of fluid holes.

In other features, a plurality of valves are arranged in the first plurality of fluid holes, respectively. The plurality of valves are configured to selectively control flow of electrolyte solution in the first plurality of fluid holes. The array controller is configured to control the valves. A positioning device is configured to adjust a position of at least one of the work piece substrate and the anode substrate. The positioning device moves the at least one of the work piece substrate and the anode substrate during printing of the metal interconnects.

In other features, the array controller is configured to a) print first metal interconnects on the work piece substrate; b) cause the positioning device to move the work piece substrate relative to the anode substrate at least one of laterally and vertically by the second predetermined gap; and c) print second metal interconnects on the work piece substrate. The array controller is configured to repeat b) and c) one or more times.

In other features, the first predetermined gap is in a range from 0.1 micrometers to 100 micrometers. The first predetermined gap is in a range from 0.5 micrometers to 10 micrometers.

In other features, a plurality of valves is associated with the plurality of fluid holes, respectively. The array controller is configured to control the valves to adjust at least one of a direction and a pattern of fluid flowing from the plurality of fluid holes arranged adjacent to each of the plurality of anodes. The plurality of control devices is selected from a group consisting of switches and fuses.

A method for printing metal interconnects on a substrate includes providing a work piece substrate including one or more underlying layers, a barrier/adhesion layer and a seed layer; providing an anode substrate including a plurality of anodes arranged on one side of the substrate and a first plurality of holes having ends between the plurality of anodes. The plurality of anodes are spaced from adjacent ones of the plurality of anodes by a first predetermined gap. The method includes arranging the anode substrate within a second predetermined gap of a work piece substrate including a metal seed layer. A ratio of the second predetermined gap to the first predetermined gap is in a range from 0.5:1 and 1.5:1. The method includes energizing selected ones of the plurality of anodes while electrolyte solution is supplied through the first plurality of holes between the anode substrate and the work piece substrate.

In other features, the plurality of anodes comprise inert anodes. The method includes arranging a second plurality of fluid holes between the plurality of anodes to remove the electrolyte solution from between the anode substrate and the work piece substrate. The method includes supplying an electrolyte solution to a plenum in the anode substrate. The method includes attaching a manifold to the anode substrate with outlets of the manifold in fluid communication with the first plurality of fluid holes. The method includes using a plurality of valves to control flow in the first plurality of fluid holes.

In other features, the method includes adjusting a position of at least one of the work piece substrate and the anode substrate. The method includes a) printing first metal interconnects on the work piece substrate; b) moving the work piece substrate relative to the anode substrate at least one of laterally and vertically; and c) printing second metal interconnects on the work piece substrate.

In other features, the method includes repeating b) and c) one or more times. The first predetermined gap is in a range from 0.1 micrometers to 100 micrometers. The first predetermined gap is in a range from 0.5 micrometers to 10 micrometers.

In other features, the method includes controlling fluid flow in the first plurality of fluid holes using a plurality of valves, respectively; and controlling the valves to adjust at least one of a direction and a pattern of fluid flowing from the first plurality of fluid holes arranged adjacent to each of the plurality of anodes.

In other features, the method includes adjusting a position of at least one of the work piece substrate and the anode substrate during printing of the metal interconnects.

A method for printing metal interconnects on a substrate includes providing a work piece substrate including one or more underlying layers, a barrier/adhesion layer and a seed layer; providing an anode substrate including a plurality of anodes arranged on one side of the substrate. The plurality of anodes are spaced from adjacent ones of the plurality of anodes by a first predetermined gap. The method includes arranging the anode substrate within a second predetermined gap of a work piece substrate including a metal seed layer. A ratio of the second predetermined gap to the first predetermined gap is in a range from 0.5:1 and 1.5:1. The method includes energizing selected ones of the plurality of anodes while electrolyte solution is supplied between the anode substrate and the work piece substrate; separating the anode substrate and the work piece substrate; arranging the anode substrate within the second predetermined gap of the work piece substrate; and energizing selected ones of the plurality of anodes while the electrolyte solution is supplied between the anode substrate and the work piece substrate.

In other features, the method includes agitating the electrolyte solution after separating the anode substrate and the work piece substrate. The method includes arranging the anode substrate within the second predetermined gap of the work piece substrate after agitating the electrolyte solution.

In other features, the plurality of anodes comprise inert anodes. The method includes supplying an electrolyte solution between edges of the anode substrate and the work piece substrate.

In other features, the method includes adjusting a position of at least one of the work piece substrate and the anode substrate. The method includes a) printing first metal interconnects on the work piece substrate; b) moving the work piece substrate relative to the anode substrate at least one of laterally and vertically; and c) printing second metal interconnects on the work piece substrate. The method includes repeating b) and c) one or more times. The first predetermined gap is in a range from 0.1 micrometers to 100 micrometers. The first predetermined gap is in a range from 0.5 micrometers to 10 micrometers. The method includes adjusting a position of at least one of the work piece substrate and the anode substrate during printing of the metal interconnects.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure relate to an efficient, high-rate, two dimensional (2D) (or single layer) and/or three dimensional (3D) (multi-level) metal printing process with semiconductor-interconnect-scale resolution to create interconnects at lower cost, using less equipment, and with higher productivity. More particularly, the systems and methods described herein can be performed without the common steps, equipment and material of photoresist lithography, develop, dielectric etch, clean and/or other steps described above.

Systems and methods according to the present disclosure relate to formation of semiconductor-scale metal interconnect wires using a direct electrochemical printing process. The metal interconnect wires are deposited onto a substrate including a metal-seed layer by supplying a metal-cation-containing electrolyte solution in a gap between the work piece substrate and anodes of an anode substrate.

Figure 1A:
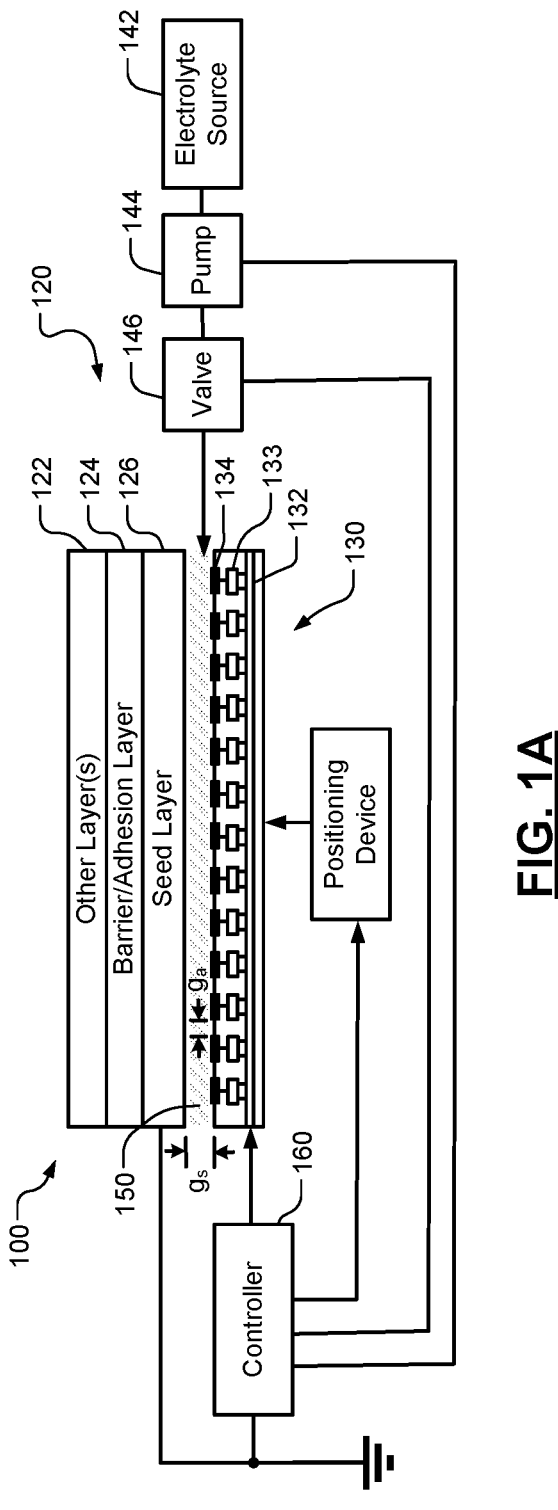
FIG. 1A is a functional block diagram of a processing system for metal printing of metal interconnects on a work piece substrate according to the present disclosure.

Referring now to FIG. 1A, an example of a substrate processing system 100 for metal printing interconnects or other features on a substrate is shown. A work piece substrate 120 includes one or more underlying layers 122, a barrier/adhesion layer 124 arranged on the one or more underlying layers 122 and a metal seed layer 126 arranged on the barrier/adhesion layer 124.

An anode substrate 130 includes an interconnect layer 132, control devices 133 and an array of anodes 134. In some examples, the control devices 133 include switches such as one or more transistors, a fuse and/or other control devices. In some examples, the anode substrate 130 is configured once and then reused. For example, the fuses are either blown (to prevent power from reaching the anodes 134) or not blown (to allow power to reach the anodes 134). In other examples, the control devices 133 include switches/transistors that are configured and reconfigured depending on the desired patterns to be produced by the anodes 134. In one more example, the anode array is manufactured to have a specific layout of anodes, more specifically a layout that is useful for, and associated with the manufacturing of a single interconnect design for a semiconductor film onto a substrate where at least some of the anodes 134 are all connected to a common power source.

In some examples, the control devices 133 operate in a binary mode including either on or off. In other examples, the control devices 133 operate in variable modes including a range of values between fully off and fully on. For example, the control device can be designed with a variable resistance so that the current to it and the other elements can be individually controlled to give different amounts of current flow. While the anodes 134 are shown as rectangular, elliptical, circular, polygonal or other shapes can be used.

The interconnect layer 132 provides routing and wiring connections including conductors, traces, vias, etc. from a controller, power supplies and/or other devices located external to the anode substrate 130. For example only, the interconnect layer 132 provides power and/or control signals to each of the control devices 133. Depending upon their states, the control devices 133 selectively supply current to the anodes 134 of the control devices 133.

In some examples, the anodes 134 are arranged in a grid or array and are uniformly spaced from adjacent anodes 134 by a gap $g_a$. In other examples, to simplify the anode substrate 130, the anodes 134 are not arranged in a grid but are arranged in predetermined locations corresponding to a desired pattern to be printed (and are not located in other locations). The work piece substrate 120 and the anode substrate 130 are spaced by a gap $g_s$. An electrolyte solution source 142, a pump 144 and/or one or more valves 146 may be used to supply the electrolyte solution into the gap $g_s$.

In some examples, the metal seed layer 126 includes 1000 Å copper (Cu) deposited on the barrier/adhesion layer 124 both deposited by using a PVD deposition tool. In some examples, the barrier/adhesion layer 124 includes 100 Å tantalum (Ta) deposited using PVD. The one or more layers 122 may include a silicon wafer, glass substrate, organic substrate, etc. The electrolyte solution will include a metal salt, for example, it may include copper sulfate aqueous solution. It may further include an acid to increase the solutions conductivity and improve the solutions throwing power (e.g. sulfuric acid), as wall as one or more plating additives of different additive classes (e.g. plating accelerators, suppressor, levelers, grain refiners etc.). Other electrolyte solutions can also be used as known in the art.

The deposition occurs on the substrate by applying a negative (cathodic) potential to the metal seed layer 126 relative to a positive potential applied to one or anodes 134 of the anode substrate 130. In some examples, the anodes 134 of the anode substrate 130 can be switched on and off and generally supply the same voltage or current potential when on. In other examples, the anodes 134 of the anode substrate 130 can be switched on and off and can be controlled to supply varying voltage or current potentials.

The anodes 134 of the anode substrate 130 and the seed layer 126 of the work piece substrate 120 are positioned closely together so the electric field generated by the anodes 134 of the anode substrate 130 doesn't have the space to spread or diffuse, and therefore is focused (proximity focused) and writes with high selectively in regions immediately adjacent to the anodes 134 of the anode substrate 130 that are activated. In some examples, the shape of the anode is projected onto the seed layer in the form of metal interconnects.

A controller 160 may be used to control states of the control devices 133, the valve 146, the pump 144 and/or a positioning device 162. The positioning device 162 is used to position the work piece substrate 120 and/or the anode substrate 130. In some examples, the positioning device 162 positions the work piece substrate 120 and/or the anode substrate 130 and printing of metal interconnects is performed. Then the positioning device 162 repositions the work piece substrate 120 and/or the anode substrate 130 and printing of metal interconnects is performed on the same work piece substrate 120. The process can involve plating, stop plating, moving, then plating again. Alternatively the process may involve simply moving the work piece relative to the anode substrate continuously at constant speed with the anode energized/on, or moved at a time-variable speed. The direction of relative movement can change over the course of the plating process as well. These process steps can be repeated one or more times for the same work piece substrate 120 to create a pattern of metal interconnects.

Figure 1B:
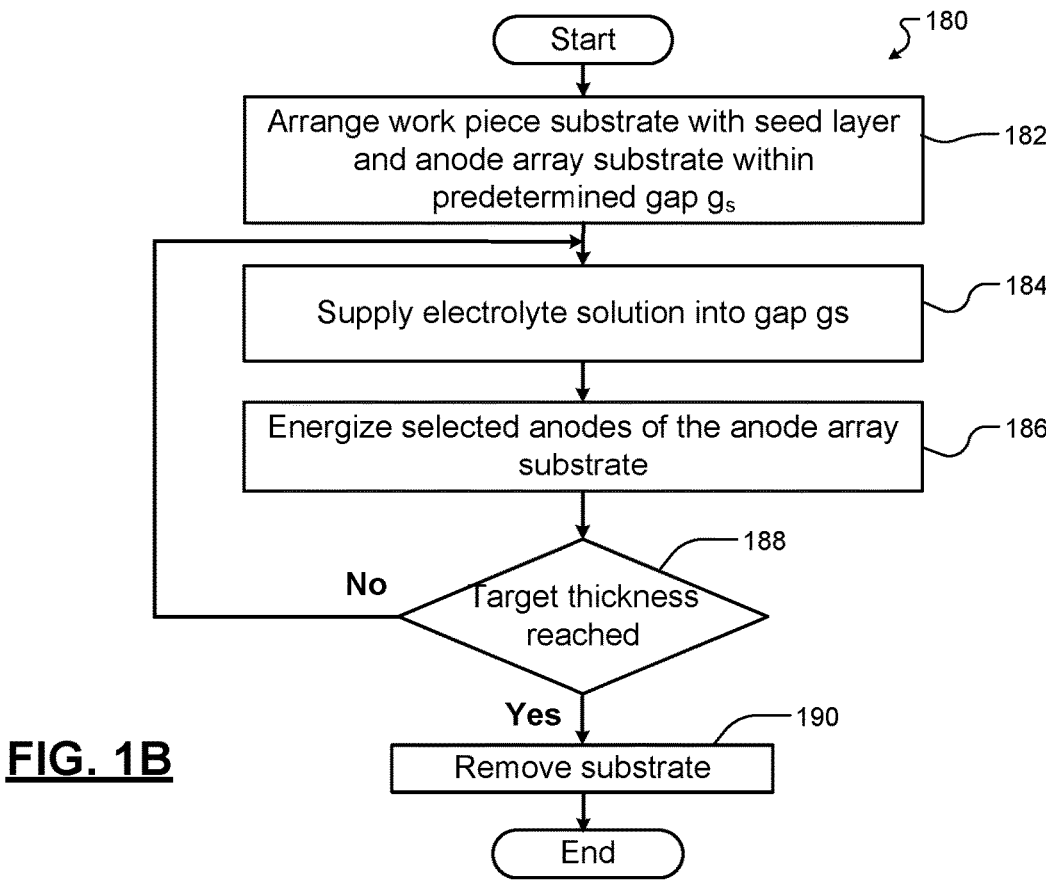
FIG. 1B is a flowchart of an example of a method for printing metal interconnects on a work piece substrate according to the present disclosure.

Referring now to FIG. 1B, a method 180 for printing interconnects on a substrate is shown. At 182, a substrate is arranged with a seed layer and anode substrate within predetermined distance or gap $g_s$. At 184, electrolyte solution is supplied in the gap $g_s$ between the work piece substrate and the anode substrate. At 186, selected anodes of the anode substrate are energized. At 188, the method determines whether a target thickness is reached. If 188 is false, the method returns to 186 until the target thickness is reached. When the target thickness is reached, the substrate is removed at 190.

Because the gap between a surface of the seed layer 126 and the anodes 134 of the anode substrate 130 is small, the fluid volume and metal ion capacity in the electrolyte solution is also very small. Furthermore, the capacity for the electrolyte solution to uptake and dissolve oxygen (which is formed at the anodes 134 of the anode substrate 130 that are activated) without bubble nucleation/formation is limited.

Generally, electrodeposition of metal from metal ions in an electrolyte solution onto a metallized seeded substrate requires the substrate to be at a potential below a reduction potential of the metal ions in the solution. For example, to plate pure copper onto a copper seeded wafer, the electrolyte solution should contain copper (and not any other metals with a more positive reduction potential) and the potential of the metal film is made more negative/cathodic than the copper reduction potential.

This is accomplished by applying a potential difference between the seed layer 126 and selected anodes 134 (and the electrolyte solution). The controller 160 supplies control signals to the control devices 133 and selected ones of the anodes 134 of the anode substrate 134.

The rate of deposition of copper onto the seed layer 126 depends to how negative of a reduction potential is applied and exists at various points across the surface of the seed layer 126. In other words, a more negative potential generally corresponds to faster charge transfer rates or high surface reaction rates to reduce cupric ion to copper ion. The deposition rate also depends on the mass transfer resistance of the copper ions to reach the surface of the seed layer 126, which can be reduced with flow intensity, as well as the temperature of the solution.

The anode can generally be of two types: an active type or an inert type. The active type oxidizes metal of the anode itself (for example a copper anode dissolves to form cupric ion). In other words, the anodes are consumed in the process. In active type applications, an array of anodes control the physical location where plating occurs. The active type application has the advantage of generally not depleting or consuming the electrolyte solution of the metal ion in the thin gap between the anode 134 and the work piece substrate 120.

However, the active type application has the disadvantage of corroding in the process, which reduces the useful life of the anodes 134 in the substrate processing system. For example, anodes that are not being used are not consumed whereas anodes that are being used are consumed. Over time, active anodes will be recessed relative to non-active anodes, which will cause reducing deposition rates over time and/or other problems.

In inert type applications, the anodes 134 of the anode substrate 130 are made of a corrosion resistant inert material. An inert anode can electrochemically oxidize an element of an electrolyte (e.g. water) while not being substantially oxidized/corroded itself. Inert type anodes 134 are exposed to the electrolyte solution and are made of a dimensionally and oxidatively chemically-stable material. For example, the inert type electrodes can be made of one or more noble metals whose oxidation potential is positive relative to the oxidation potential of water (1.23V vs. NHE) and other metals which can form a stable oxidation film and thereby can oxidize water without themselves being significantly corroded. For example, the anodes can be made of gold, platinum, palladium, ruthenium, rhodium, niobium, vanadium and alloys of these materials. Carbon (including various amorphous and graphitic forms) may also be used for the inert anodes if the composition of the electrolyte solution does not lead to substantial oxidation.

The advantage of using a dimensionally stable inert anode is that the distance between the array surface and the surface of the working piece is predictable and constant over time. However, using inert anodes leads to the depletion of the supply of metal ions in the electrolyte during deposition.

The two half reactions that occur combine to create the overall reaction in the system and are:

$$M^{+z} + ze^- \rightarrow M \qquad \text{Workpiece/Substrate/Cathode Reduction:}$$

$$z/2*[2H_2O \rightarrow O_2 + 2H^+ + 2e^-] \qquad \text{Micro-Inert Anode Array Oxidation:}$$

$$M^{+z} + zH_2O \rightarrow M + z/2O_2 + zH^+ \qquad \text{Overall reaction:}$$

Where $M^{+z}$ is a dissolved metal ion (e.g. copper, nickel, tin, silver etc.) that has an oxidation state of z (e.g. z=+2 for a cupric ion). Without replenishment, the ions of the metal are depleted in the small gap as half reaction 1 progresses and metal is deposited. A larger gap would allow for more metal to be deposited. However, the small gap is maintained so that each separate anode writes only in the area directly opposite its position. With a larger gap than about 1:1 (gap distance/anode size), the electric field spreads out from the element and the plating area is large and can overlap the plating of adjacent anodes.

As a specific example of how quickly the depletion of the metal ion supply in the gap can occur, consider a 50 µm anode spaced 50 µm from a substrate with the anode spacing being 100 µm. Copper metal is plated from a concentrated (near saturated) ambient temperature copper sulfate electrolyte solution (80 g/L or 1.25M cupric ion) in this example. The volume of the fluid in the gap is 100 µm×100 µm×50 µm=500,000 µm³ and contains $1.25e^{-10}$ moles, $4.0e^{-8}$ µm of copper and 4400 cubic microns of copper. Assuming the copper is only plated in the direct anode projected area onto the substrate (50*50=250 µm²), depleting 100% of the copper from the region above and around the anode would lead to a film of under 7 µm thick.

However, before depletion is reached, the process efficiency will drop and oxygen bubbles will form on the anodes and hydrogen bubbles form on the substrate surface. The presence of bubbles in the gap or on the surface of the substrate or anode block the passage of current and stops the reaction. Because the anodes are 50 μm in size, the device could not create a 1:1 aspect ratio feature (50 μm tall and 50 μm in width/length) or a 3D printed pattern. Therefore electrolyte replenishment is needed.

Referring to the second half reaction, $O_2$, produced at the surface of the anodes, will first dissolve in the electrolyte solution in the gap. However, the solubility of $O_2$ is very low (e.g. @8 ppm in water at ambient temperatures), and quickly becomes supersaturated and will nucleate to form oxygen bubbles. The oxygen bubbles are non-conductive and fill the gap area between the anodes and the substrate surface. Current is diverted around the oxygen bubbles, which leads to non-uniform plating on the substrate, and eventually the oxygen bubbles stop the reaction completely.

While $O_2$ in the electrolyte solution can be reduced at the substrate simultaneously with the metal deposition, most metal surfaces that are being plated on the substrate are not catalytic for that type of reaction. Also, the concurrent reaction leads to a variable efficiency for metal deposition processes and unpredictable deposition rates from one anode to another. Therefore in some examples, the systems and methods according to the present disclosure replenish the electrolyte in the gap to circumvent this problem.

A computer simulation of the current density distribution on a substrate under conditions of electrolyte ohmic resistance control, created by solving the Laplace's equation in the gap of various values, with edge boundary symmetry conditions, and a no flux boundary condition, was performed. Activated anodes were assumed to generate a current density of $100 \, A/m^2$. The current flows to the substrate, which is held at a lower reference potential such as ground potential. The electrolyte conductivity is set to 0.01 S/m and the 1 μm anodes have a gap from 0.75 to 3.5 um.

The computer simulations showed that using electrolyte ohmic resistance control as simulated (also known as under "primary current distribution" control), the activated anodes of the anode substrate generate distinct and separate plating images of the activated anodes when the gap to feature size is less than or equal to 1.5 to 1 and greater than or equal to 0.5 to 1. In other examples, the gap to feature size is less than or equal to 1.2 to 1 and greater than or equal to 0.8 to 1. In other examples, the gap to feature size is less than or equal to 1.1 to 1 and greater than or equal to 0.9 to 1.

At larger gaps, the image is smeared and is not useful, and at smaller gaps the resolution of the metal interconnects is greatly improved. This data shows that for small integrated circuit packaging, where the scales are in the range of from 1 μm to 100 μm, or for the front end wiring needs where the scales are typically 5 to 500 nm, the gaps will need to be quite small and replenishing the supply of metal ions inside the gap will enable a continuous process.

One approach for replenishing the gap with metal ions is to flow new fluid into the gap space from one side of the array/substrate and have the waste/depleted material exit at the opposite side. When forming a relatively large 25 μm feature that is 25 μm high using a 25 μm gap and a reasonably productive deposition rate of 7 μm/min, the solution under the gap is replaced. For example, the electrolyte solution may be replaced approximately about every 15 seconds (which is the point in time when about ¼ of the ions in the gap will have been depleted without flow).

Because the gap is so small, the pressure required to create the flow in this gap is high. For an array that is 30 cm long and wide, with a gap of 50 μm, the volume of fluid in the gap is 4.5 $cm^3$ a flow rate of 18 $cm^3/min$ is required to replenish the plated material at the 7 μm/min rate. This flow is required independent of the gap size. As the gap gets smaller, the initial amount of available metal ions in the gap decreases linearly. Without a commensurate reduction in the plating rate with gap size, the time to depletion will linearly decrease. Therefore, for this mass transfer limited process, a constant flow rate is used to maintain the same deposition rate for any size gap.

Figure 2:
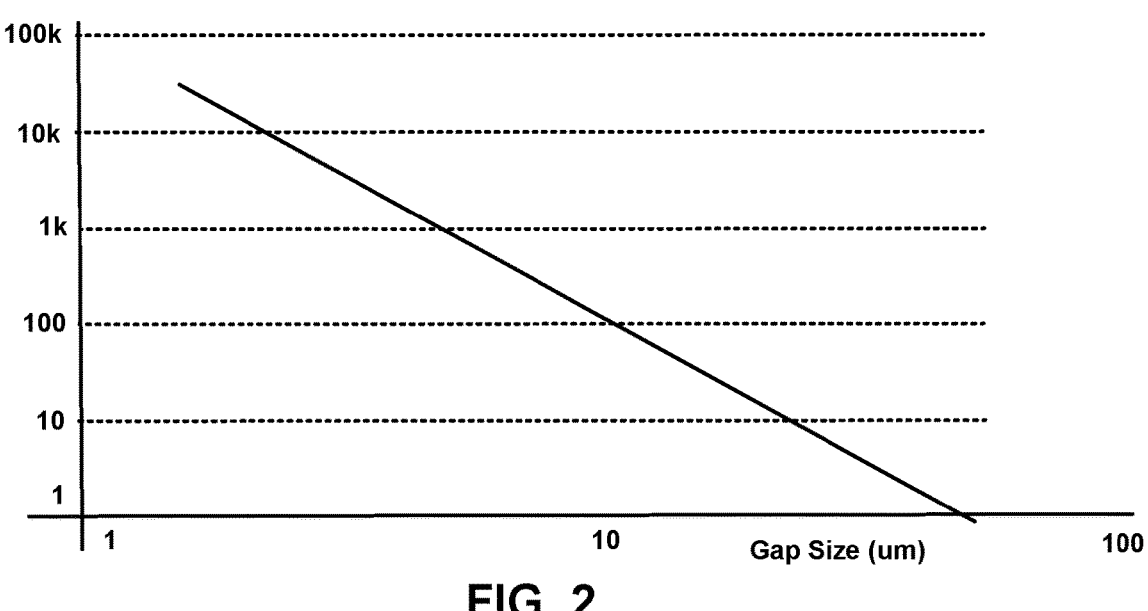
FIG. 2 is a graph illustrating the pressure drops per cm for electrolyte solution flow through an array as a function of gap size.

Referring now to FIG. 2, the calculated pressure drop across the array that is required to keep the plating rate constant (e.g. 7 μm/min at average gap concentration reduced from 80 to 60 g/l) for various gap sizes into a 30 cm anode array per 1 cm of array length. For a 25 μm size gap, a 10 cm length array (likely a minimally useful length), a pressure of 68 kPa (10 psi) is applied which quickly increases to 550 kPa (80 psi) for a 12 μm gap.

Use of these pressures may tend to drive the work piece substrate and anode substrate apart and add to the general complexity of the system. Furthermore, while this leads to material replenishment generally, the upstream side of the electrolyte injection will be substantially richer in copper than the downstream side. Because the substrate is a single coated surface and is substantially held at a single cathodic potential, the rate of plating will be significantly less at the flow exiting side (downstream side) than the flow entry side (the upstream side). In other words, the total potential drop is the same for each anode but the mass transfer resistance will be different so the deposition rate will vary.

Such a reduced concentration in upstream anode gap spaces would require one to apply a more anodic potential to upstream anodes of the anode substrate to compensate for the higher mass transfer resistance. Alternatively, this effect can be compensated for by having each anode at a given distance from the inlet point have a different applied current or anodic potential. The control devices 133 may be used to compensate for the higher mass transfer resistance experienced by the upstream anodes and keep the current density to, and the plating rate of each of the growing plated elements the same.

This approach has the disadvantage of having more complicated wiring and a more complex power controller. The upstream points operate under conditions of higher mass transfer polarization, which is generally different than the inlet anodes. As a result, the plated metal will not be formed with the same and possibly unsatisfactory grain structure, uniformity and shape, efficiency, etc. Considering the buildup of oxygen in the gap from the anodic reaction, the entrance region of the array will have its oxygen removed as dissolve material, but the electrolyte in the gaps downstream will have the cumulative uptake of oxygen from all upstream anode production, and will likely nucleate and be filled with bubbles and function with less efficiency.

Figure 3:
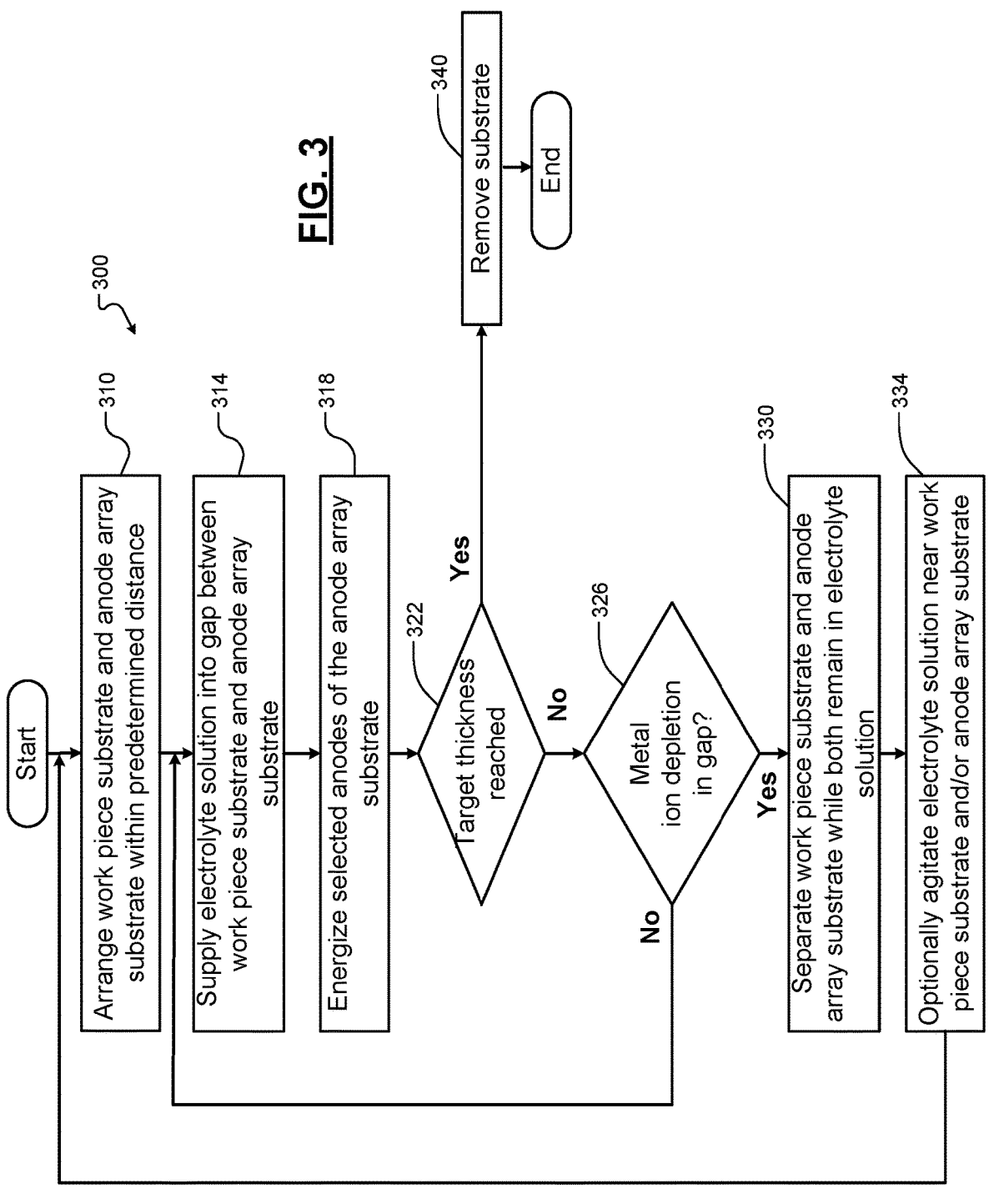
FIG. 3 is a flowchart of an example of a method for printing metal interconnects on a work piece substrate according to the present disclosure.

Referring now to FIG. 3, an example of a method 300 to resupply electrolyte solution in the gap $g_s$ efficiently and without excess applied pressure is shown. The method 300 uses a cyclical gap formation and opening process. The work piece substrate and the anode substrate are arranged within the predetermined gap $g_s$ at 312. At 314, electrolyte solution is supplied into the gap $g_s$ between work piece substrate and anode substrate. At 318, selected anodes of the anode substrate are energized to define an interconnect pattern. At 322, the method determines whether the target metal thickness is reached. If false, the method determines whether there is ion depletion in the gap at 326. This determination may be time based, measured or determined in another manner.

If 326 is false, the method returns to 318. If 326 is true, the method separates the work piece substrate and the anode substrate while both remain in electrolyte solution. At 334, the electrolyte solution is optionally agitated near surfaces of the work piece substrate and/or the anode substrate.

In this process, the work piece substrate or anode substrate are moved into position (with the predetermined gap $g_s$) is created as needed for the particular resolution of the part being printed. After plating the wafer and creating the structure for a predetermined period, the work piece substrate and the anode substrate are moved apart while both remain covered in the electrolyte solution.

In some examples, the work piece substrate or anode substrate are moved a distance greater than 10 or more times the plating gap distance. This allows new electrolyte to flow into the gap between the two parts and in from the edges of the anode substrate. This action improves flow and agitates fluid near the surfaces and in the gap during the time that the gap is open. Then, the work piece substrate and the anode substrate are moved together again to the target plating gap setting. This process may involve a repeated sequence of aligning and creating a precise gap between the array and the wafer over the extent of the array.

Figure 4:
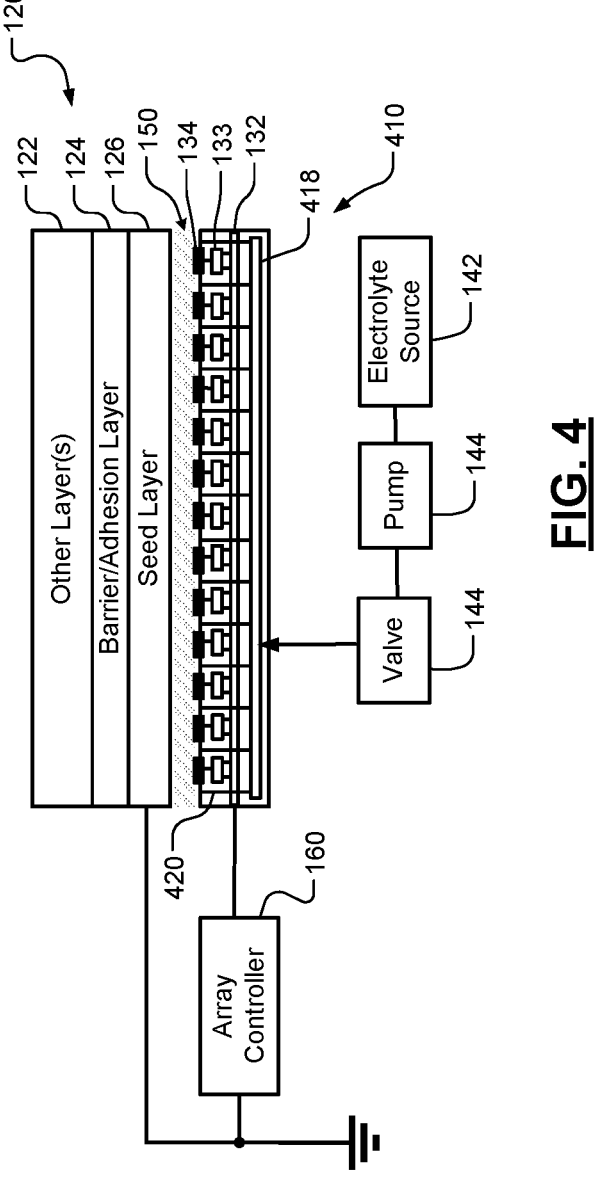
FIG. 4 is a functional block diagram of a processing system for metal printing of metal interconnects on a work piece substrate according to the present disclosure.
Figure 5A:
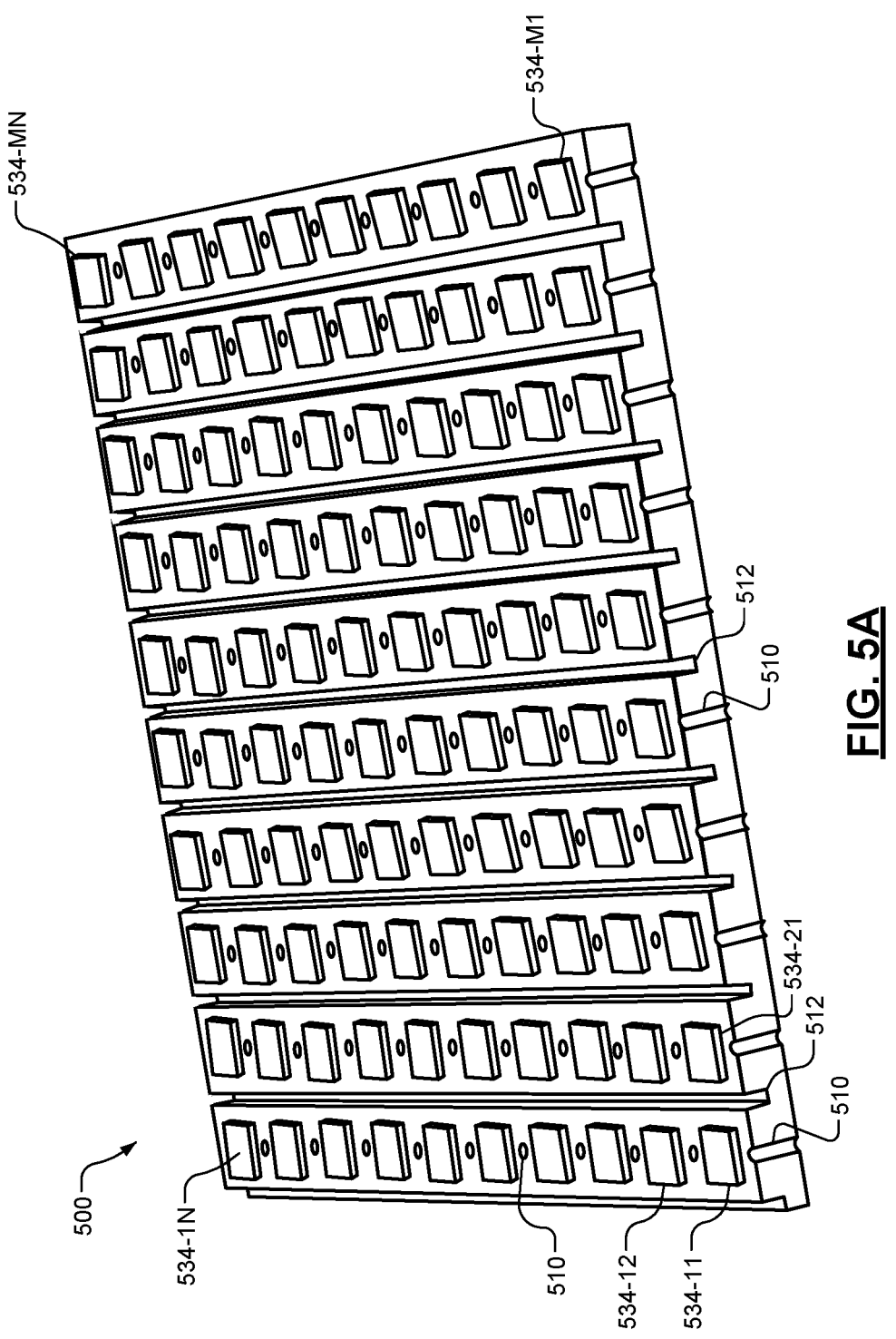
FIG. 5A is a perspective view of an anode substrate including an array of anodes according to the present disclosure.
Figures 5B, 5C:
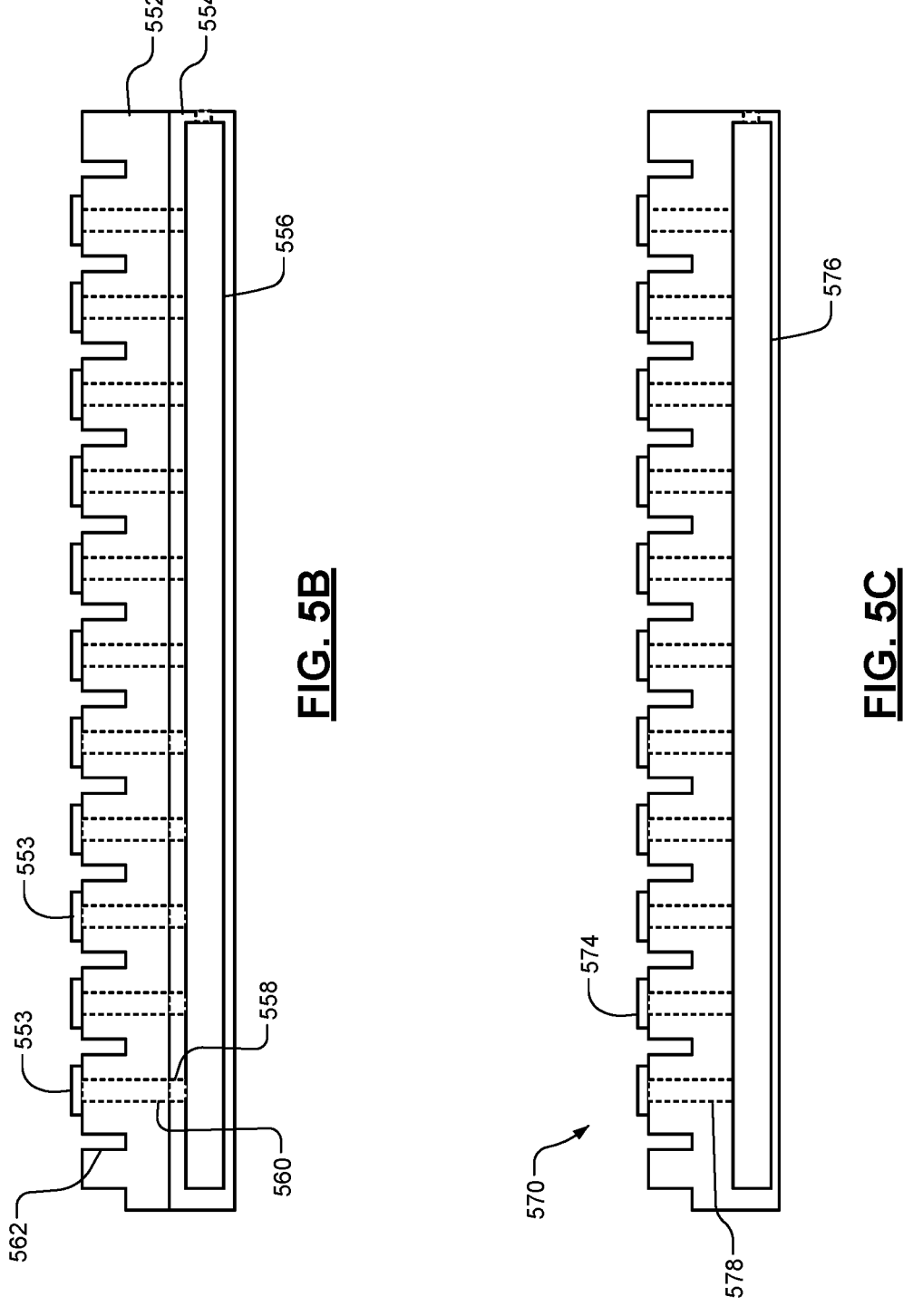
FIG. 5B is a side cross-sectional view of another example of an anode substrate including anodes and an external manifold according to the present disclosure.
FIG. 5C is a side cross-sectional view of an example of an anode substrate including an integrated plenum according to the present disclosure.
Figures 5D, 5E:
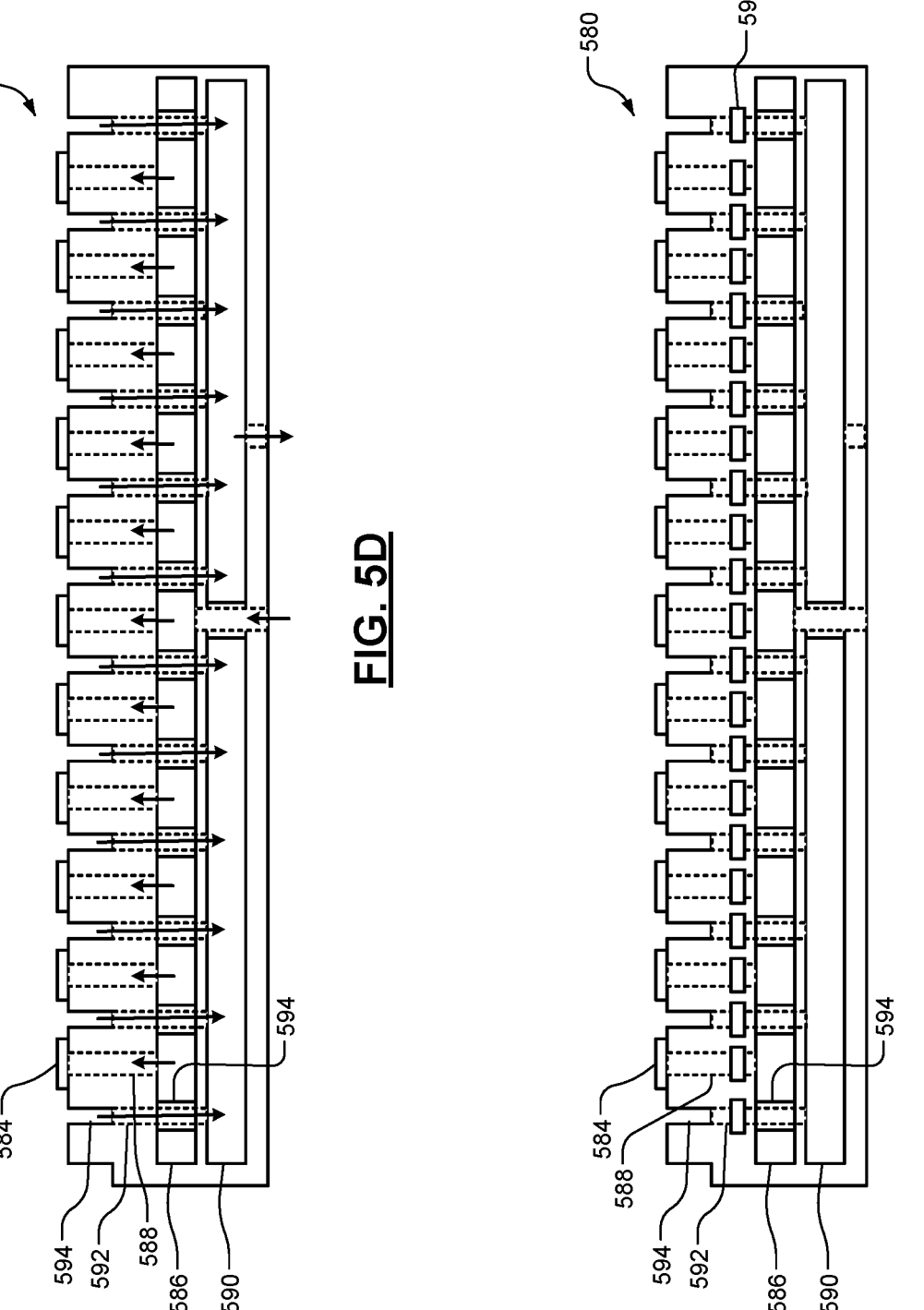
FIG. 5D is a side cross-sectional view of an example of an anode substrate including first and second integrated plenums according to the present disclosure.
FIG. 5E is a side cross-sectional view of an example of an anode substrate including first and second integrated plenums and valves according to the present disclosure.

Referring now to FIGS. 4 to 5E, examples of anode substrates according to the present disclosure includes one or more electrolyte delivery features such as external manifolds and/or internal plenums, flow fluid holes, trenches, etc. to supply electrolyte solution into and/or remove electrolyte solution from the gap $g_s$.

For example in FIG. 4, the anode substrate 410 includes a plenum 418 and fluid holes 420 extending from the plenum 418 to a first surface of the anode substrate 410 facing the work piece substrate 120. In some examples, the fluid holes 420 are located between the anodes 414. The electrolyte solution is supplied to the plenum 418, through the fluid holes 420 and into the gap $g_s$ between the work piece substrate 120 and the anode substrate 410.

In FIGS. 5A to 5E, other examples of the anode substrate and fluid delivery are shown. In FIG. 5A, an anode substrate 500 includes anodes 534-11, 534-12, . . . , and 534-MN (collectively anodes 534), where M and N are integers greater than one). Holes 510 are shown from a first or lower surface of the anode substrate 500 to a second or upper surface of the anode substrate 500. For example, the holes 510 to deliver and/or remove the electrolyte solution are arranged between the anodes 534 in rows or columns. For example, trenches 512 are arranged between the anodes 534 in the columns or rows on the first or top side to remove electrolyte solution. In this example, one or more external manifolds are used to supply or remove electrolyte solution. In some examples, the electrolyte solution flows from the manifold, through the holes, across the anodes 534 and into the trenches 512.

In FIG. 5B, a manifold 554 is attached to a lower surface of an anode substrate 552. The anode substrate 552 includes anodes 553. The manifold 554 includes a plenum 556 and holes 556 in fluid communication with the plenum 556. Holes 560 of the anode substrate 552 are aligned with the holes 558 of the manifold 554.

In FIG. 5C, an anode substrate 570 includes anodes 574, a plenum 576 integrated with the anode substrate 570, and holes 578 in fluid communication with the plenum 576.

In FIG. 5D, an anode substrate 580 includes anodes 584, a first plenum 586 and a second plenum 590. Electrolyte solution flows into the first plenum 586 and fluid holes 588 to a top surface of the anode substrate 580. For example, the fluid holes 588 may extend from the first plenum 586 to locations between the anodes 584.

Fluid holes 592 connect the trenches 594 (or the top surface) of the anode substrate 580 to the second plenum 590. For example, the fluid holes 592 may extend from the second plenum 590 to locations along bottom surfaces of trenches 594. Electrolyte solution is pumped into or otherwise flows into the first plenum 586 and through the fluid holes 588 onto the top surface of the anode substrate 580. The electrolyte solution flows into regions between the anodes 584 and corresponding regions on the work piece substrate. The electrolyte solution eventually flows into the trenches 594, through the fluid holes 592 and into the second plenum 590.

In FIG. 5E, valves 596 such as microelectromechanical valves can be arranged in one or more of the fluid holes 588 and/or 592 to allow selectively control of delivery of the electrolyte solution to various locations. In some examples, the valves 596 are controlled by the controller 160 using the interconnect layer 132 described above.

Figure 6A:
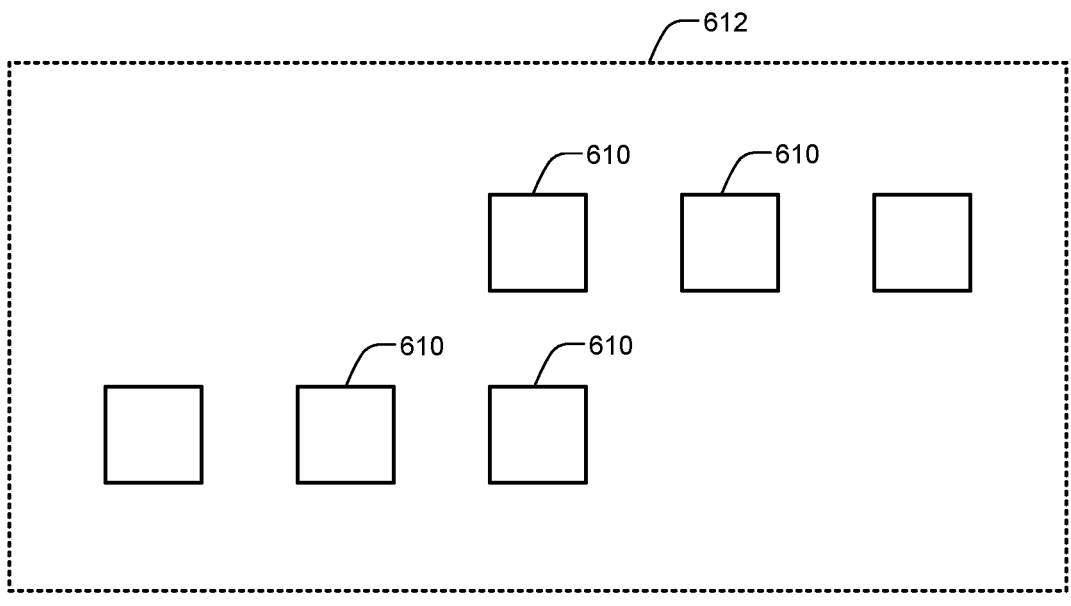
FIGS. 6A to 6G illustrate metal printing on the work piece substrate according to the present disclosure.
Figure 6B:
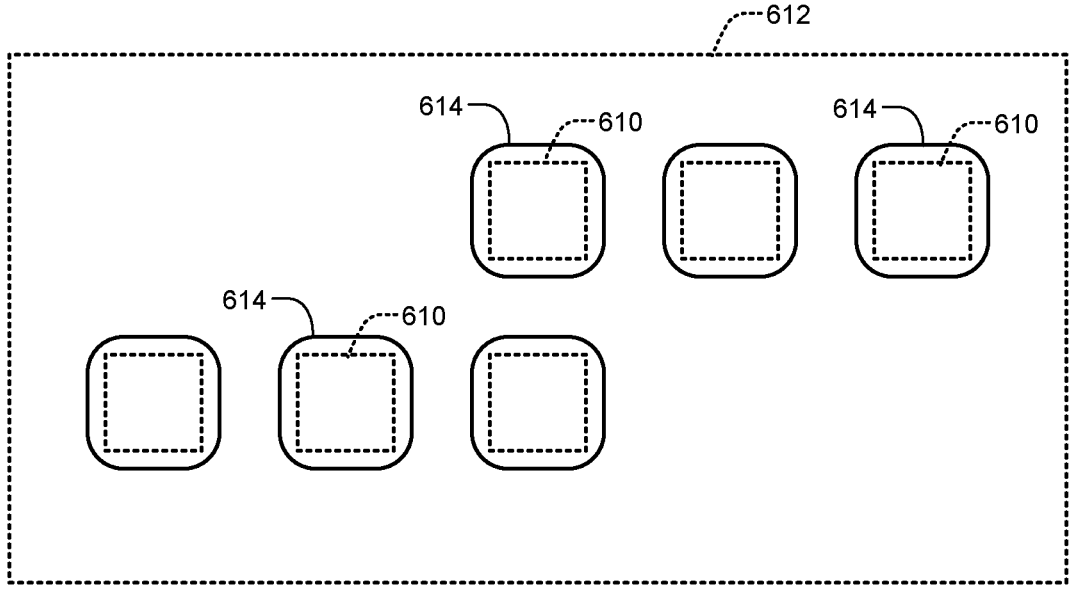
Figure 6C:
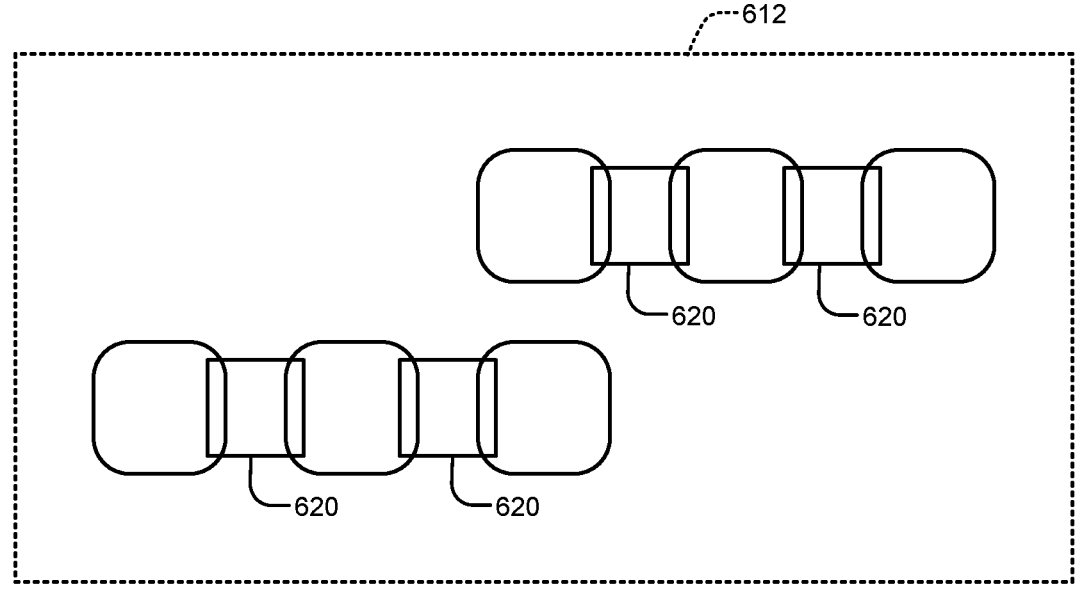
Figure 6D:
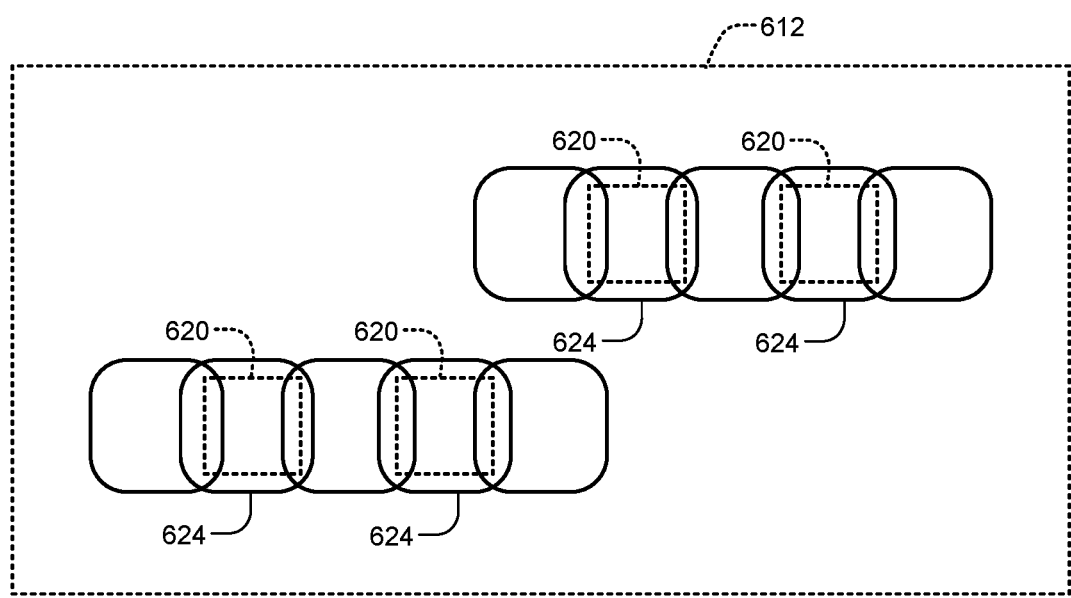
Figure 6E:
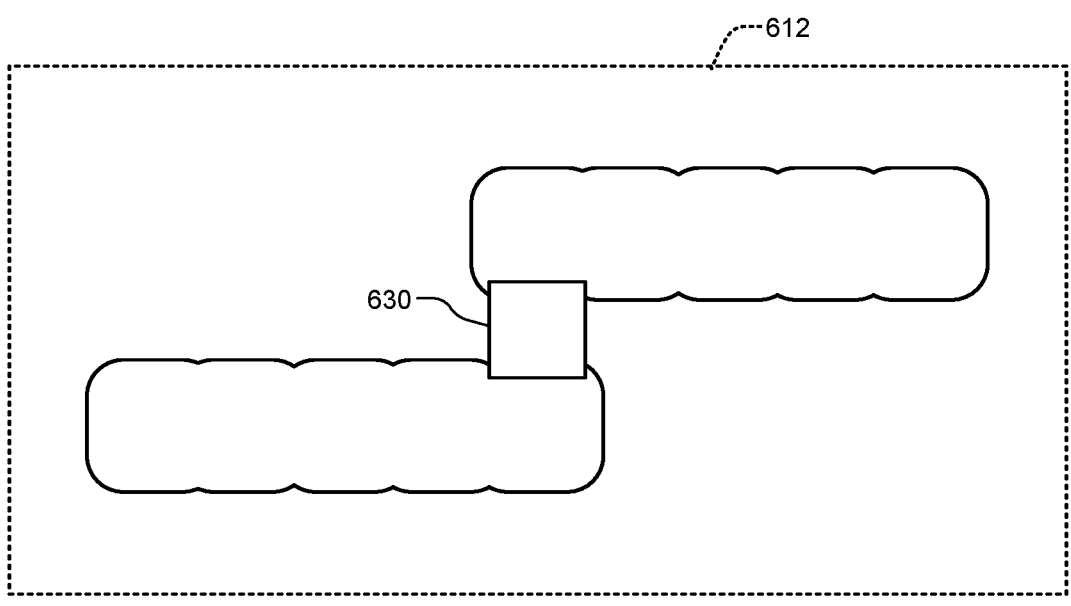
Figure 6F:
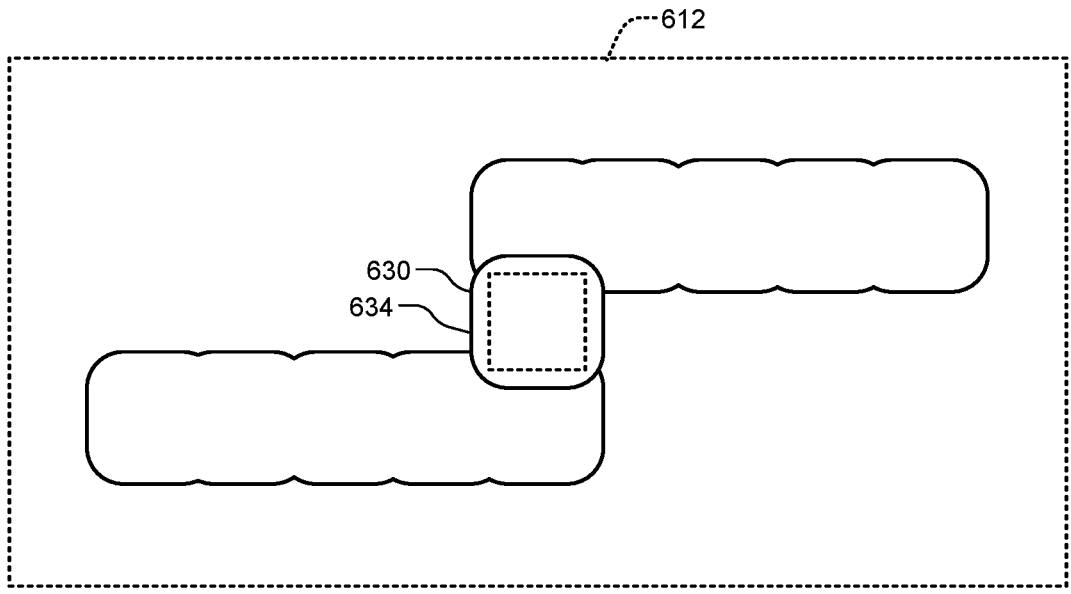
Figure 6G:
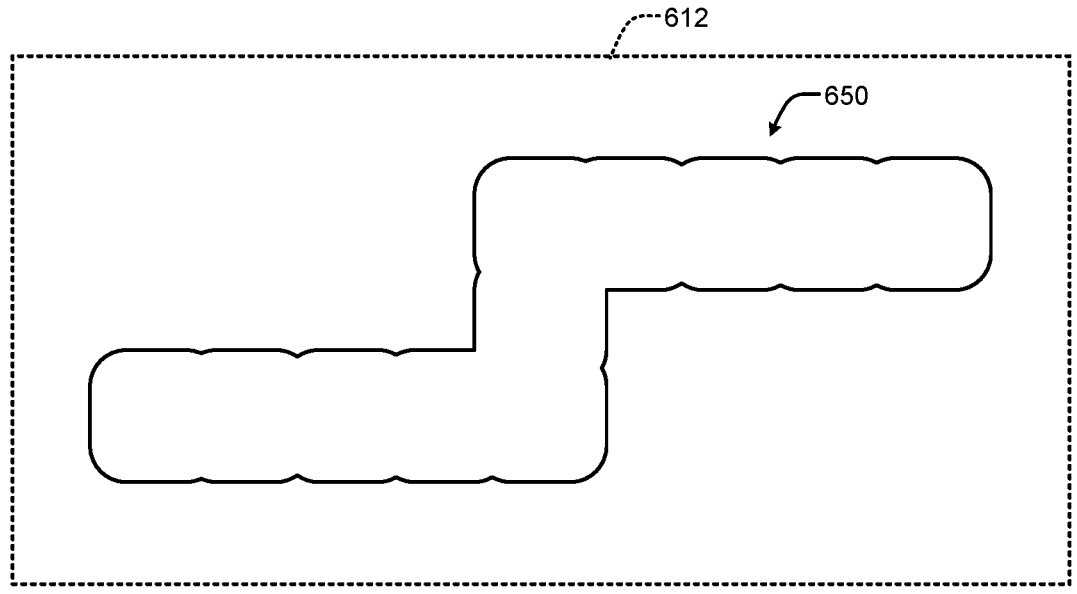

Referring now to FIGS. 6A and 6G, an example of metal printing onto a work piece substrate is shown. In FIG. 6A, a first set of anodes 610 (only anodes that are to be energized are shown) are arranged within the predetermined gap $g_s$ of a work piece substrate 612. Electrolyte solution is delivered into the predetermined gap $g_s$ and some of the anodes are energized as described above. In FIG. 6B, metal interconnects 614 are deposited in a region around the first set of energized anodes 610 on the work piece substrate 612 and then the first set of anodes 610 is de-energized (as shown by dotted lines).

In FIG. 6C, the anode substrate is moved laterally relative to the work piece substrate (the anode substrate is within the predetermined gap $g_s$ of the work piece substrate 612). Electrolyte solution is delivered into the predetermined gap $g_s$ and a second set of anodes 620 (arranged within the predetermined gap $g_s$ of the work piece substrate 612) is energized. In FIG. 6D, metal interconnects 624 are deposited in a region around the second set of energized anodes 620 on the work piece substrate 612 and then the second set of anodes 620 is de-energized (as shown by dotted lines).

In FIG. 6E, the anode substrate is moved laterally and downwardly relative to the work piece substrate. Electrolyte solution is delivered into the predetermined gap $g_s$ and a third set of anodes 630 (arranged within the predetermined gap $g_s$ of the work piece substrate 612) is energized. In FIG. 6F, metal interconnects 634 are deposited in a region around the third set of anodes 630 on the work piece substrate 612 and then the third set of anodes 630 is de-energized (as shown by dotted lines).

In FIG. 6G, a completed metal interconnect 650 is shown. After the metal interconnects are printed, a mask layer may be deposited and patterned. Etching is performed to remove the metal seed layer in areas where the metal interconnects are not printed and then the mask layer is removed.

Figure 7:
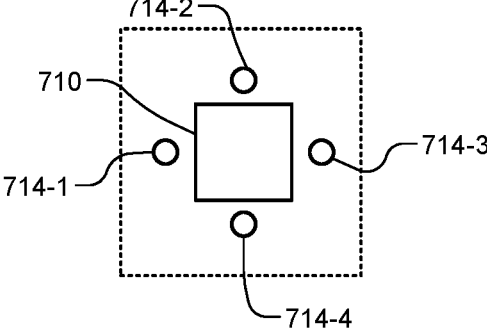
FIG. 7 is a plan view of an anode of the anode substrate and electrolyte supply fluid holes according to the present disclosure.
Figure 8:
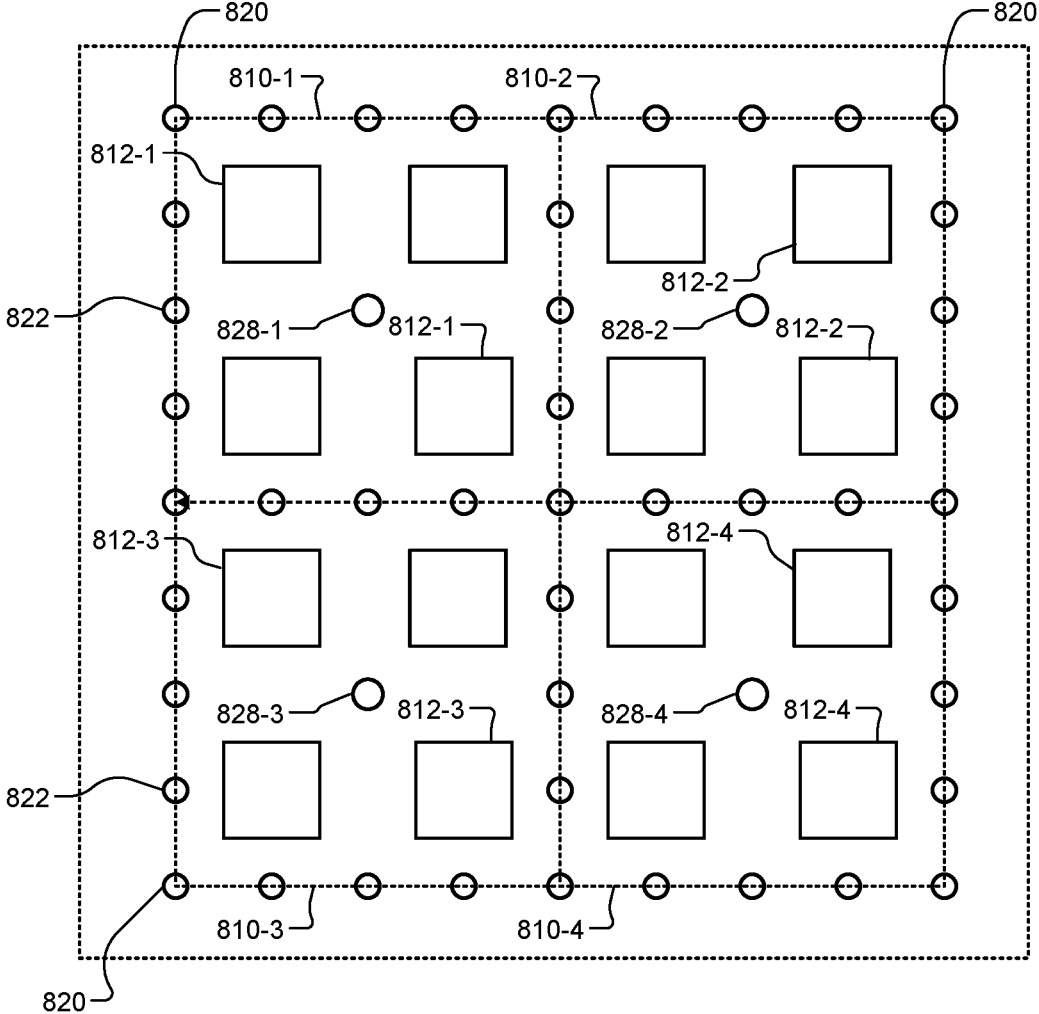
FIG. 8 is a plan view of a group of adjacent anodes of the anode substrate and surrounding electrolyte supply fluid holes according to the present disclosure according to the present disclosure.

Referring now to FIGS. 7 and 8, the location and number of inlets and/or outlets can be varied. In FIG. 7, adding additional locations for inlet/outlet fluid holes and manifolds (e.g. 1, 2, 3, 4 or more) allow combinations of inlet and outlet holes to be used. Valves can be used to cycle through different trajectories of fluid paths over time. For example, FIG. 7 shows an anode 710 with four fluid holes 714-1, 714-2, 714-3 and 714-4 surrounding the anode 810.

In one method of operation, the valves are configured to allow fluid flow from fluid hole 714-1 and out fluid hole 714-3 for a first predetermined period. Then fluid flows from fluid hole 714-2 and out fluid hole 714-4 for a second predetermined period. Then, fluid flow from fluid hole 714-1 and out fluid hole 714-3 for a first predetermined period.

Then fluid flows from fluid hole 714-4 and out fluid hole 714-2 for a third predetermined period. Alternatively, fluid can flow into the gap simultaneously from fluid holes 714-1 and 714-3 and out fluid holes 714-2 and 714-4 and then the direction of fluid flow is reversed. Therefore, when multiple manifolds are present, the flow direction and flow pattern can be modified to make the flow directions more time-average-uniform.

Referring to FIG. 8, groups of anodes 812-1, 812-2, 812-3 and 812-4 (in this example, each group includes 4 anodes) surround central fluid holes 828-1, 828-2, 828-3 and 828-4, respectively. Fluid holes 820 and 822 surround the groups of anodes 812-1, 812-2, 812-3 and 812-4. In some examples, the central fluid holes 828-1, 828-2, 828-3 and 828-4 have a larger diameter than the set of fluid holes 820 and 822.

The fluid holes 820 and 822 are connected to one fluid delivery and return manifold and holes 828 are connected to another fluid delivery and return manifold. The dotted lines in FIG. 8 show the flow symmetry boundary of this arrangement surround each of the groups and define flow unit cells.

The set of fluid holes 820 and 822 include two types. The fluid holes 822 are located at the edge of the symmetry boundary and the fluid holes 822 at the corners. In some examples, half of the fluid holes 822 go to or from a corresponding one of the central fluid holes 828. The other half of the fluid holes 822 go to or from another one of the central fluid holes 828.

The fluid holes 820 in the corners feed or remove ¼ of their fluid to the nearby centrally located holes 828. As before, the flow can either be feed into or out of the type types of peripheral flow element sand into or out of the centrally located one. Also, the flow holes 822 can be fed by four unique and separately controllable flow manifolds. Other arrangements of holes and number of distribution manifolds can be used with the goal of creating the possibility of multiple different flow directions and paths in the gap and across the surface to allow the pattern to be randomized by using various sets over time and reversing the flow patterns.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for printing metal interconnects on a substrate, comprising:
    providing a work piece substrate including one or more underlying layers, a barrier/adhesion layer and a seed layer;
    providing an anode substrate including a plurality of anodes arranged on one side of the work piece substrate and a first plurality of holes having ends between the plurality of anodes, wherein the plurality of anodes are spaced from adjacent ones of the plurality of anodes by a first predetermined gap;
    arranging the anode substrate spaced by a second predetermined gap from the work piece substrate including a metal seed layer, and wherein a ratio of the second predetermined gap to the first predetermined gap is in a range from 0.5:1 and 1.5:1; and
    energizing selected ones of the plurality of anodes while electrolyte solution is supplied through the first plurality of holes between the anode substrate and the work piece substrate.

2. The method of claim 1, wherein the plurality of anodes comprise inert anodes.

3. The method of claim 1, further comprising arranging a second plurality of fluid holes between the plurality of anodes to remove the electrolyte solution from between the anode substrate and the work piece substrate.

4. The method of claim 1, further comprising supplying an electrolyte solution to a plenum in the anode substrate.

5. The method of claim 1, further comprising attaching a manifold to the anode substrate with outlets of the manifold in fluid communication with the first plurality of fluid holes.

6. The method of claim 1, further comprising using a plurality of valves to control flow in the first plurality of fluid holes.

7. The method of claim 1, further comprising adjusting a position of at least one of the work piece substrate and the anode substrate after energizing the selected ones of the plurality of anodes.

8. The method of claim 7, further comprising:
    a) printing first metal interconnects on the work piece substrate;
    b) moving the work piece substrate relative to the anode substrate at least one of laterally and vertically; and
    c) printing second metal interconnects on the work piece substrate.

9. The method of claim 8, further comprising repeating b) and c) one or more times.

10. The method of claim 1, wherein the first predetermined gap is in a range from 0.1 micrometers to 100 micrometers.

11. The method of claim 1, wherein the first predetermined gap is in a range from 0.5 micrometers to 10 micrometers.

12. The method of claim 2, further comprising:
    controlling fluid flow in the first plurality of fluid holes using a plurality of valves, respectively; and
    controlling the valves to adjust at least one of a direction and a pattern of fluid flowing from the first plurality of fluid holes arranged adjacent to each of the plurality of anodes.

13. The method of claim 1, further comprising adjusting a position of at least one of the work piece substrate and the anode substrate during printing of the metal interconnects.

14. A method for printing metal interconnects on a substrate, comprising:
    providing a work piece substrate including one or more underlying layers, a barrier/adhesion layer and a seed layer;
    providing an anode substrate including a plurality of anodes arranged on one side of the substrate, wherein the plurality of anodes are spaced from adjacent ones of the plurality of anodes by a first predetermined gap;
    arranging the anode substrate within a second predetermined gap of the work piece substrate, and wherein a ratio of the second predetermined gap to the first predetermined gap is in a range from 0.5:1 and 1.5:1;
    energizing selected ones of the plurality of anodes while electrolyte solution is supplied between the anode substrate and the work piece substrate;
    separating the anode substrate and the work piece substrate while the anode substrate and the work piece substrate remain in the electrolyte solution;
    repositioning the anode substrate and the work piece substrate by arranging the anode substrate spaced by the second predetermined gap from the work piece substrate; and
    energizing selected ones of the plurality of anodes while the electrolyte solution is supplied between the anode substrate and the work piece substrate.

15. The method of claim 14, further comprising agitating the electrolyte solution after separating the anode substrate and the work piece substrate.

16. The method of claim 14, further comprising arranging the anode substrate within the second predetermined gap of the work piece substrate after agitating the electrolyte solution.

17. The method of claim 14, wherein the plurality of anodes comprise inert anodes.

18. The method of claim 14, further comprising supplying an electrolyte solution between edges of the anode substrate and the work piece substrate.

19. The method of claim 14, further comprising adjusting a position of at least one of the work piece substrate and the anode substrate.

20. The method of claim 19, further comprising:
  a) printing first metal interconnects on the work piece substrate;
  b) moving the work piece substrate relative to the anode substrate at least one of laterally and vertically; and
  c) printing second metal interconnects on the work piece substrate.

21. The method of claim 20, further comprising repeating b) and c) one or more times.

22. The method of claim 14, wherein the first predetermined gap is in a range from 0.1 micrometers to 100 micrometers.

23. The method of claim 14, wherein the first predetermined gap is in a range from 0.5 micrometers to 10 micrometers.

24. The method of claim 14, further comprising adjusting a position of at least one of the work piece substrate and the anode substrate during printing of the metal interconnects.

\* \* \* \* \*